US007965802B2

(12) United States Patent
Ozawa

(10) Patent No.: US 7,965,802 B2
(45) Date of Patent: Jun. 21, 2011

(54) CLOCK DATA RESTORING DEVICE

(75) Inventor: Seiichi Ozawa, Wako (JP)

(73) Assignee: Thine Electronics, Inc., Tokyo (JP)

( * ) Notice: Subject to any disclaimer, the term of this patent is extended or adjusted under 35 U.S.C. 154(b) by 535 days.

(21) Appl. No.: 12/159,752

(22) PCT Filed: Sep. 6, 2007

(86) PCT No.: PCT/JP2007/067397
§ 371 (c)(1),
(2), (4) Date: Jun. 30, 2008

(87) PCT Pub. No.: WO2008/044406
PCT Pub. Date: Apr. 17, 2008

(65) Prior Publication Data
US 2009/0232195 A1   Sep. 17, 2009

(30) Foreign Application Priority Data

Oct. 12, 2006   (JP) .................................. 2006-278994

(51) Int. Cl.
*H04L 7/00* (2006.01)
(52) U.S. Cl. ........................................ 375/355; 375/371
(58) Field of Classification Search .................. 375/232, 375/326, 327, 350, 355, 371
See application file for complete search history.

(56) References Cited

U.S. PATENT DOCUMENTS

| 2004/0240531 A1 | 12/2004 | Black et al. |
| 2006/0034394 A1* | 2/2006 | Popescu et al. ............... 375/326 |
| 2010/0046601 A1* | 2/2010 | Momtaz et al. ............... 375/233 |

FOREIGN PATENT DOCUMENTS

| DE | 102005022684 A1 | 12/2005 |
| JP | 5-67374 A | 3/1993 |
| JP | 7-221800 A | 8/1995 |
| JP | 2000-151397 A | 5/2000 |
| JP | 2004-507963 A | 3/2004 |
| JP | 2005-27175 A | 1/2005 |
| JP | 2005-341582 A | 12/2005 |
| JP | 2007-151044 A | 6/2007 |
| WO | 0219528 A2 | 3/2002 |
| WO | 2007/058279 A1 | 5/2007 |

* cited by examiner

*Primary Examiner* — Don N Vo
(74) *Attorney, Agent, or Firm* — Sughrue Mion, PLLC

(57) ABSTRACT

The clock data restoration device 1 is a device which restores a clock signal and data on the basis of an input digital signal and comprises an equalizer section 10, a sampler section 20, a clock generation section 30, an equalizer control section 40, and a phase monitor section 50. As a result of the loop processing of the equalizer section 10, the sampler section 20, and the equalizer control section 40, a control of a level adjustment amount of the digital signal by the equalizer section 10 is carried out. However, the control is stopped by the phase monitor section 50 when the phase difference between the clock signal CK and the digital signal is greater than a predetermined value. As a result, a clock signal and data can be restored more accurately.

4 Claims, 13 Drawing Sheets

Fig.5

| D(n-1) | DX(n-1) | D(n) | UP | DN |
|---|---|---|---|---|
| 0 | 0 | 0 | 0 | 0 |
| 0 | 0 | 1 | 0 | 1 |
| 0 | 1 | 0 | 0 | 0 |
| 0 | 1 | 1 | 1 | 0 |
| 1 | 0 | 0 | 1 | 0 |
| 1 | 0 | 1 | 0 | 0 |
| 1 | 1 | 0 | 0 | 1 |
| 1 | 1 | 1 | 0 | 0 |

# CLOCK DATA RESTORING DEVICE

TECHNICAL FIELD

The present invention relates to a device for restoring a clock signal and data on the basis of a digital signal which is input.

BACKGROUND ART

The waveform of a digital signal that is output by a transmitter deteriorates while being transmitted from the transmitter to a receiver via a transmission path. Therefore, a clock signal and data are required to be restored on the receiver side. A clock data restoration device for performing such restoration is disclosed in Patent Documents 1, 2, and 3, for example.

A general clock data restoration device detects the data of an input digital signal whose waveform has deteriorated at a center time of each bit period (the detected value is denoted $D(n)$) and at a transition time from a certain bit to the next bit (the detected value is denoted $DX(n)$). Further, the clock data restoration device is able to obtain the restored clock signal and data by adjusting, based on the values $D(n)$ and value $DX(n)$, the cycle or phase of the clock signal so that the phase difference between the input digital signal and the clock signal which indicates the timing at which these values are detected is reduced.

In addition, a clock data restoration device which comprises an equalizer section which adjusts the level of the input digital signal before outputting same is known. The equalizer section compensates for the loss which the input digital signal undergoes while being transmitted from the transmitter to the receiver via the transmission path by adjusting the level of the input digital signal. The clock data restoration device detects the value $D(n)$ and value $DX(n)$ from the digital signal whose level is adjusted by the equalizer section.

[Patent Document 1] Japanese Patent Application Laid-open No. H7-221800
[Patent Document 2] Published Japanese Translation No. 2004-507963 of the PCT International Publication
[Patent Document 3] Published Japanese Translation No. 2005-341582 of the PCT International Publication

DISCLOSURE OF THE INVENTION

Problem to be Solved by the Invention

A clock data restoration device which comprises such an equalizer section of this kind restores a clock signal by means of phase and frequency control on the basis of an input signal and corrects the input signal waveform by means of an equalizer section. The correction intensity of the input signal waveform of the equalizer section is adjusted to an optimum level for cases where the loss which the signal undergoes during transmission varies, on the basis of the detected data value. In other words, the prerequisite for suitable input signal waveform correction is the accurate detection of data.

However, in cases where the phase and frequency of the clock signal which indicates the data sampling time are displaced by a large amount with respect to the input digital signal, the data cannot be accurately detected and waveform correction at a suitable intensity by the equalizer section is problematic. Hence, cases where waveform correction is not performed at a suitable intensity include cases where restoration of the phase and frequency of the clock signal readily becomes inaccurate.

The present invention was conceived in order to solve the above problem and an object of the present invention is to provide a clock data restoration device which is capable of restoring a clock signal and data more accurately.

Means for Solving the Problem

The clock data restoration device according to the present invention is a device which restores a clock signal and data on the basis of an input digital signal, comprising an equalizer section, a sampler section, a clock generation section, an equalizer control section, and a phase monitor section.

The equalizer section adjusts the level of the input digital signal and outputs the adjusted digital signal. The sampler section receives an input of a clock signal CK and a clock signal CKX which have the same cycle T as well as the digital signal output by the equalizer section. In each nth period $T(n)$ of the cycle, the sampler section samples, holds, and outputs a value $D(n)$ of the digital signal at a time $t_C$ indicated by the clock signal CK and samples, holds, and outputs a value $DX(n)$ of the digital signal at a time $t_X$ indicated by the clock signal CKX, where $t_C < t_X$ and n is an integer.

In each period $T(n)$, the clock generation section adjusts the cycle T or the phase so that the phase difference between the clock signal CK and the digital signal decreases on the basis of the value $D(n)$ and value $DX(n)$ which are output by the sampler section and outputs the clock signal CK and the clock signal CKX which satisfy the relation '$t_X - t_C = T/2$' to the sampler section.

In each period $T(n)$, the equalizer control section performs control of the level adjustment amount of the digital signal by the equalizer section on the basis of the level of the digital signal which is output by the equalizer section or the value $D(n)$ and value $DX(n)$ which are output by the sampler section, and, in each period $T(n)$, the phase monitor section detects the phase relation between the clock signal CK and the digital signal on the basis of the value $D(n)$ and value $DX(n)$ which are output by the sampler section and, when the phase difference is greater than a predetermined value, stops control of the level adjustment amount of the digital signal by the equalizer control section.

The digital signal input to the clock data restoration device is first level-adjusted by the equalizer section and input to the sampler section. The clock signal CK and the clock signal CKX which have the same cycle T are also input to the sampler section. Furthermore, in each of the nth periods $T(n)$ of the cycle, the sampler section samples, holds, and outputs the value $D(n)$ of the digital signal at the time indicated by the clock signal CK and samples, holds, and outputs the value $DX(n)$ of the digital signal at the time indicated by the clock signal CKX. The value $D(n)$ and value $DX(n)$ which are output by the sampler section are each input to the clock generation section and phase monitor section.

The clock generation section adjusts the cycle T or the phase on the basis of the value $D(n)$ and value $DX(n)$ output by the sampler section so that the phase difference between the clock signal CK and the digital signal decreases and outputs the clock signal CK and the clock signal CKX which satisfy the relation '$t_X - t_C = T/2$' to the sampler section. As a result of the loop processing of the sampler section and the clock generation section, the clock signal CK or CKX is generated as a clock signal which is restored on the basis of the input digital signal.

The equalizer control section performs control of the level adjustment amount of the digital signal by the equalizer section on the basis of the level of the digital signal output by the equalizer section or the value $D(n)$ and value $DX(n)$ which are output by the sampler section. However, the control by the equalizer control section is permitted or stopped on the basis of the detection result of the phase relation of the phase monitor section. In other words, the phase monitor section detects the phase relation between the clock signal CK and the digital signal on the basis of the value D(n) and value DX(n) which are output by the sampler section. Furthermore, when the phase difference is greater than a predetermined value, control of the level adjustment amount of the digital signal by the equalizer control section is stopped and, when the phase difference is equal to or less than a predetermined value, control of the level adjustment amount of the digital signal by the equalizer control section is permitted.

Thus, the clock data restoration device according to the present invention controls the level adjustment amount of the digital signal by the equalizer section by means of loop processing by the equalizer section, sampler section, and equalizer control section. However, the control is stopped by the phase monitor section when the phase difference between the clock signal CK and the digital signal is greater than a predetermined value. As a result, a clock signal and data can be more accurately restored.

The clock generation section preferably adjusts the cycle T or the phase on the basis of a UP signal which is a significant value when 'D(n−1)≠DX(n−1)=D(n)' and a DN signal which is a significant value when 'D(n−1)=DX(n−1)≠D(n)' and outputs the clock signal CK and the clock signal CKX.

The phase monitor section preferably detects the phase relation between the clock signal CK and the digital signal on the basis of a UP signal which is a significant value when 'D(n−1)≠DX(n−1)=D(n)' and a DN signal which is a significant value when 'D(n−1)=DX(n−1)≠D(n)'.

The phase monitor section, in each period T(n), preferably judges that the phase difference is greater than a predetermined value when either the UP signal or the DN signal is not a significant value in ten previous consecutive periods (T(n−9) to T(n)) which include the period, and stops control of the level adjustment amount of the digital signal by the equalizer control section.

Effect of the Invention

The present invention makes it possible to restore the clock signal and data more accurately.

BRIEF DESCRIPTION OF THE DRAWINGS

FIG. 5 shows a truth table of I/O values of a phase relation detection circuit 31 which is contained in a clock generation section 30.

DESCRIPTION OF REFERENCE SYMBOLS 1, 1A, 1B . . . clock data restoration device, 10, 10A, 10B . . . equalizer section, 20, 20A, 20B . . . sampler section, 30 . . . clock generation section, 40, 40A, 40B . . . equalizer control section, 50 . . . phase monitor section.

BEST MODES FOR CARRYING OUT THE INVENTION

The best mode for carrying out the invention will be described in detail hereinbelow with reference to the attached drawings. The same symbols are assigned to the same elements in the description of the drawings and repetitive descriptions are avoided.

Figure 1:
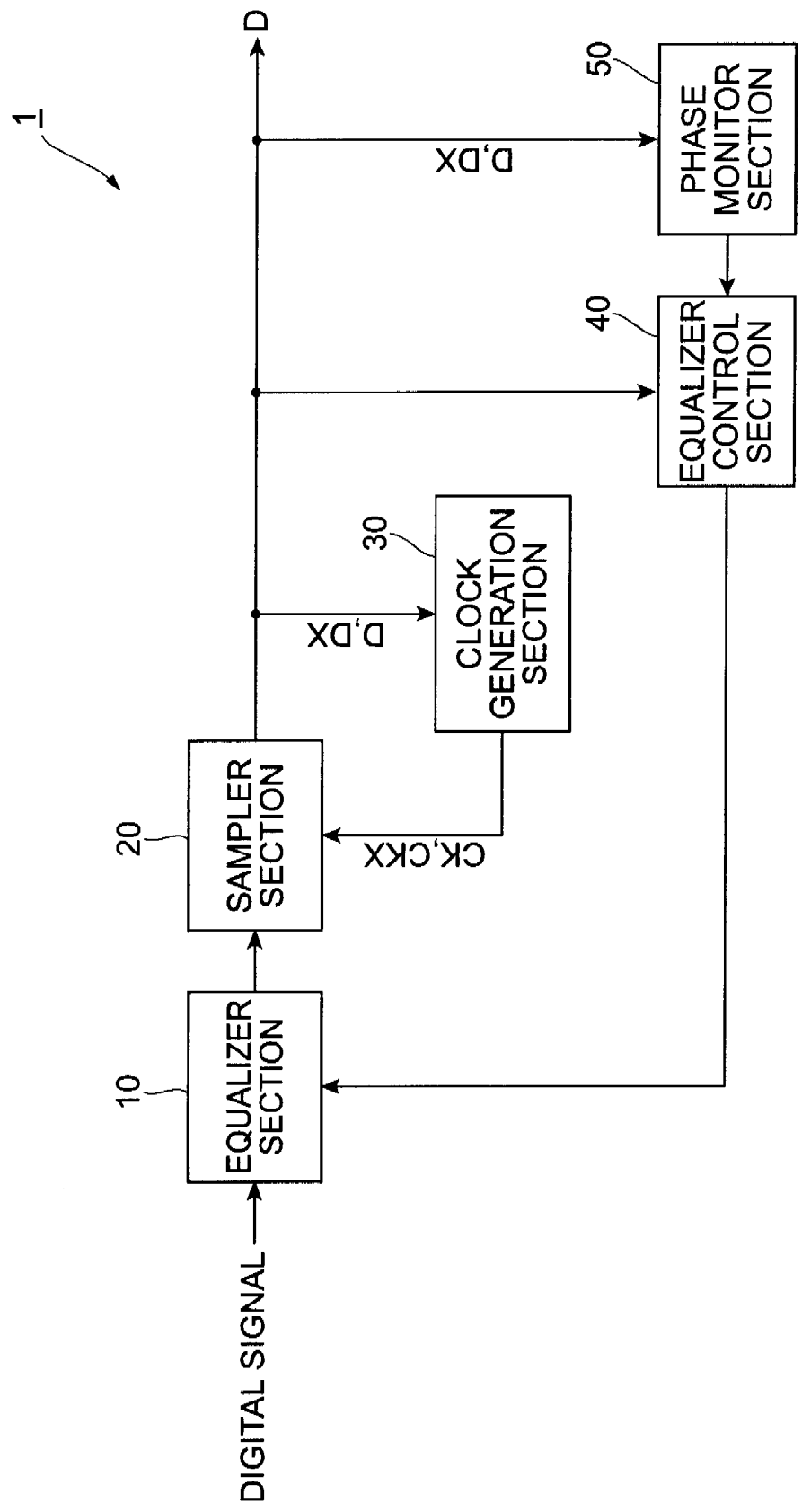
FIG. 1 is an overall constitutional view of a clock data restoration device 1 according to the present invention.

First, the overall constitution of the clock data restoration device according to the present invention will be described. FIG. 1 is an overall constitutional view of the clock data restoration device 1 according to the present invention. The clock data restoration device 1 is a device which restores a clock signal and data on the basis of a digital signal that is input and comprises an equalizer section 10, a sampler section 20, a clock generation section 30, an equalizer control section 40, and a phase monitor section 50.

Figure 2:
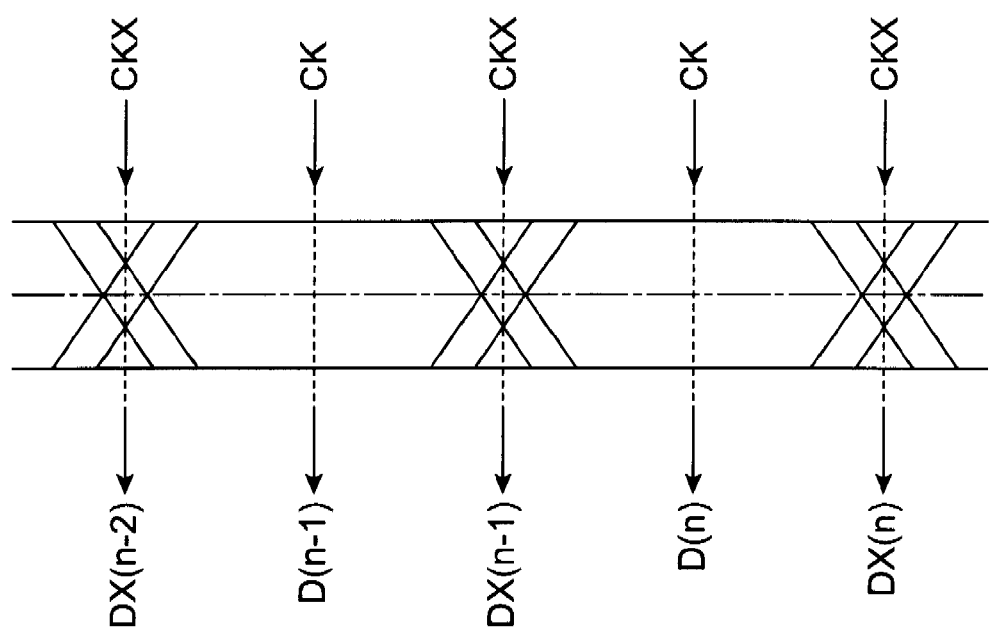
FIG. 2 shows the timing for sampling digital signal data of the clock data restoration device 1 according to the present invention.

FIG. 2 shows the timing for sampling digital signal data of the clock data restoration device 1 according to the present invention. FIG. 2 schematically shows an eye pattern of an input digital signal, shows the respective timings of a clock signal CK and a clock signal CKX which are output by the clock generation section 30 and input to the sampler section 20, and also shows the timing of the digital value D(n) and the value DX(n) which are output by the sampler section 20.

The equalizer section 10 adjusts the level of an input digital signal and outputs the adjusted digital signal to the sampler section 20. The sampler section 20 receives an input of the clock signal CK and the clock signal CKX which have the same cycle T and receives the digital signal which is output by the equalizer section 10. Further, in each nth period T(n) of the cycle, the sampler section 20 samples, holds, and outputs a digital signal value D(n) at a time $t_C$ which is indicated by the clock signal CK and samples, holds, and outputs a digital signal value DX(n) at a time $t_X$ which is indicated by the clock signal CKX, where '$t_C < t_X$' and n is an integer.

In each period T(n), the clock generation section 30 adjusts the cycle T or phase so that the phase difference between the clock signal CK and the digital signal decreases on the basis of the value D(n) and value DX(n) which are output by the sampler section 20 and outputs the clock signal CK and the clock signal CKX which satisfy the relation '$t_X − t_C = T/2$' to the sampler section 20. The clock signal CK indicates the timing for detecting the digital signal data in the sampler section 20 at the center time of each bit period and the clock signal CKX indicates the timing for detecting digital signal data in the sampler section 20 at the transition time from a certain bit to the next bit.

Each of the two clock signals, CK and CKX, may be single phase clock signals or multiphase clock signals. For example, when a case where a clock signal CK has four phases is considered, four clock signals CK<1>, CK<2>, CK<3>, and CK<4> whose respective cycles are 4T and whose phases differ from one another in steps of $\pi/2$ are employed and four latch circuits are provided in the sampler section in correspondence with these four clock signals CK<1> to CK<4>. In the case of multiphase clock signals, although the circuit scale of the sampler section is large, the speed required of each circuit clock is relaxed.

In each period T(n), the equalizer control section 40 exercises control of the level adjustment amount of the digital signal by the equalizer section 10 on the basis of the level of the digital signal output by the equalizer section 10 or the value D(n) and value DX(n) output by the sampler section 20. The phase monitor section 50 detects the phase relation between the clock signal CK and digital signal on the basis of the value D(n) and value DX(n) which are output by the sampler section 20 in each period T(n). The phase monitor section 50 then stops control of the level adjustment amount of the digital signal by equalizer control section 40 when the phase difference is greater than a predetermined value and permits control of the level adjustment amount of the digital signal by the equalizer control section 40 when the phase difference is equal to or less than a predetermined value.

The clock data restoration device 1 operates as follows. A digital signal which is output by the transmitter and has arrived via a transmission path and whose waveform has deteriorated is first level-adjusted by the equalizer section 10 and the loss which the digital signal undergoes during transmission is compensated for, and then is input to the sampler section 20. The sampler section 20 also receives an input of clock signal CK and clock signal CKX which have the same cycle T. In the sampler section 20, the digital signal value D(n) at the time indicated by the clock signal CK is sampled, held, and output in each nth period T(n) of the cycle and the digital signal value DX(n) at the time indicated by the clock signal CKX is sampled, held, and output. The value D(n) and value DX(n) which are output by the sampler section 20 are input to each of the clock generation section 30 and phase monitor section 50.

The clock generation section 30 adjusts the cycle T or the phase on the basis of the value D(n) and value DX(n) output by the sampler section 20 so that the phase difference between the clock signal CK and the digital signal decreases and outputs the clock signal CK and the clock signal CKX which satisfy the relation '$t_X - t_C = T/2$' to the sampler section 20. As a result of the loop processing of the sampler section 20 and the clock generation section 30, the clock signal CK or CKX is generated as a clock signal which is restored on the basis of the input digital signal.

The equalizer control section 40 performs control of the level adjustment amount of the digital signal of the equalizer section 10 on the basis of the level of the digital signal output by the equalizer section 10 or the value D(n) and value DX(n) which are output by the sampler section 20. However, the control by the equalizer control section 40 is permitted or stopped on the basis of the detection result of the phase relation of the phase monitor section 50. In other words, the phase monitor section 50 detects the phase relation between the clock signal CK and the digital signal on the basis of the value D(n) and value DX(n) which are output by the sampler section 20. Furthermore, when the phase difference is greater than a predetermined value, control of the level adjustment amount of the digital signal by the equalizer control section 40 is stopped and, when the phase difference is equal to or less than a predetermined value, control of the level adjustment amount of the digital signal by the equalizer control section 40 is permitted.

Thus, the clock data restoration device 1 according to the present invention controls the level adjustment amount of the digital signal by the equalizer section 10 by means of loop processing by the equalizer section 10, sampler section 20, and equalizer control section 40. However, the control is stopped by the phase monitor section 50 when the phase difference between the clock signal CK and the digital signal is greater than a predetermined value. As a result, a clock signal and data can be more accurately restored.

A more specific constitution of the clock data restoration device 1 will be described hereinbelow for the first and second embodiments. In the clock data restoration device of the first and second embodiments, although the respective constitutions of the clock generation section 30 and phase monitor section 50 are common, the constitution of equalizer section 10 differs and, accordingly, the respective constitutions of the sampler section 20 and equalizer control section 50 are also different.

First Embodiment

Figure 3:
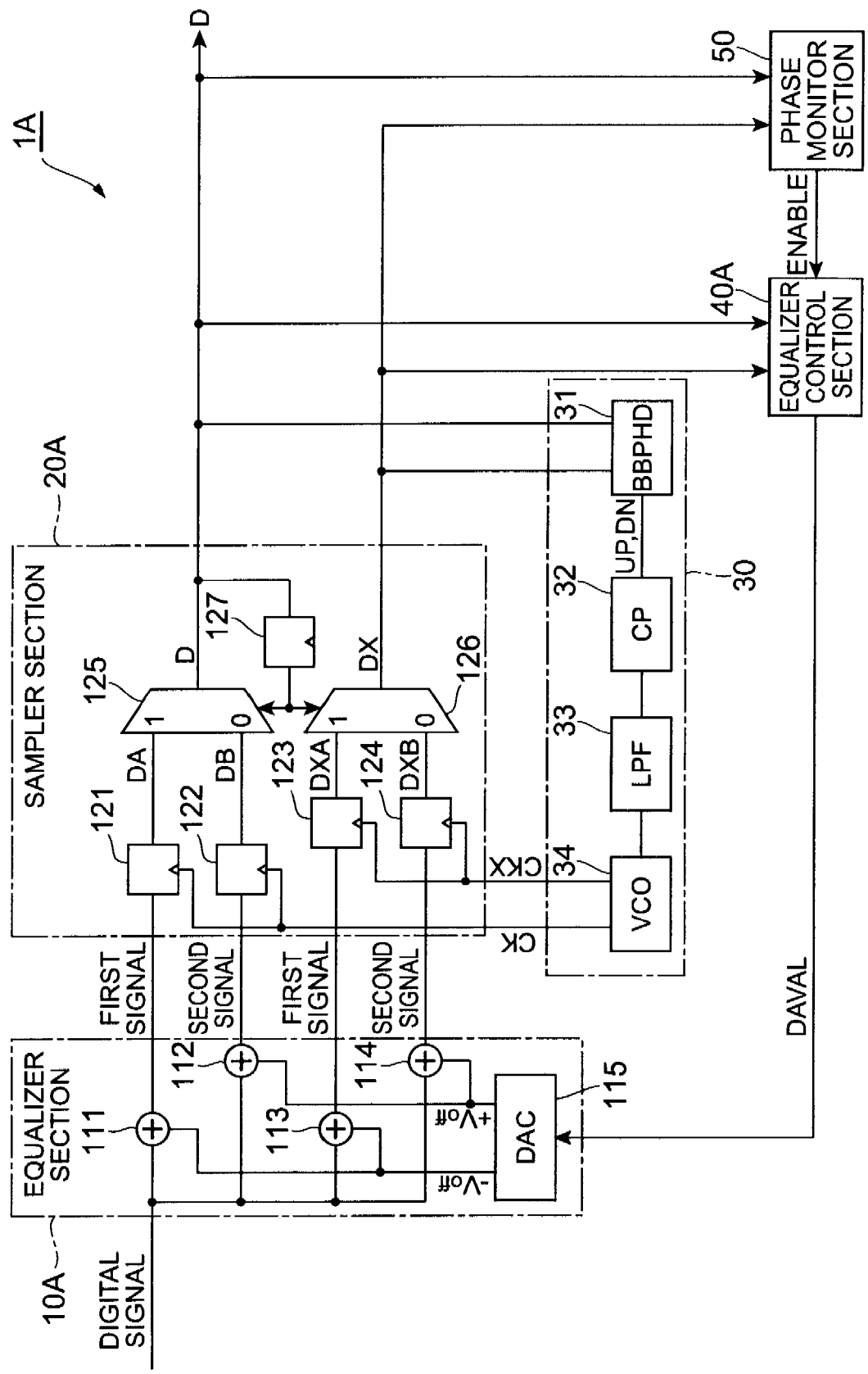
FIG. 3. is a constitutional view of the clock data restoration device 1A according to the first embodiment.

FIG. 3 is a constitutional view of the clock data restoration device 1A according to the first embodiment. The clock data restoration device 1A shown in FIG. 3 is a device which restores a clock signal and data on the basis of a digital signal which is input, comprising an equalizer section 10A, a sampler section 20A, a clock generation section 30, an equalizer control section 40A and a phase monitor section 50. FIG. 3 specifically shows the respective circuit constitutions of the equalizer section 10A, sampler section 20A and the clock generation section 30.

Figure 4:
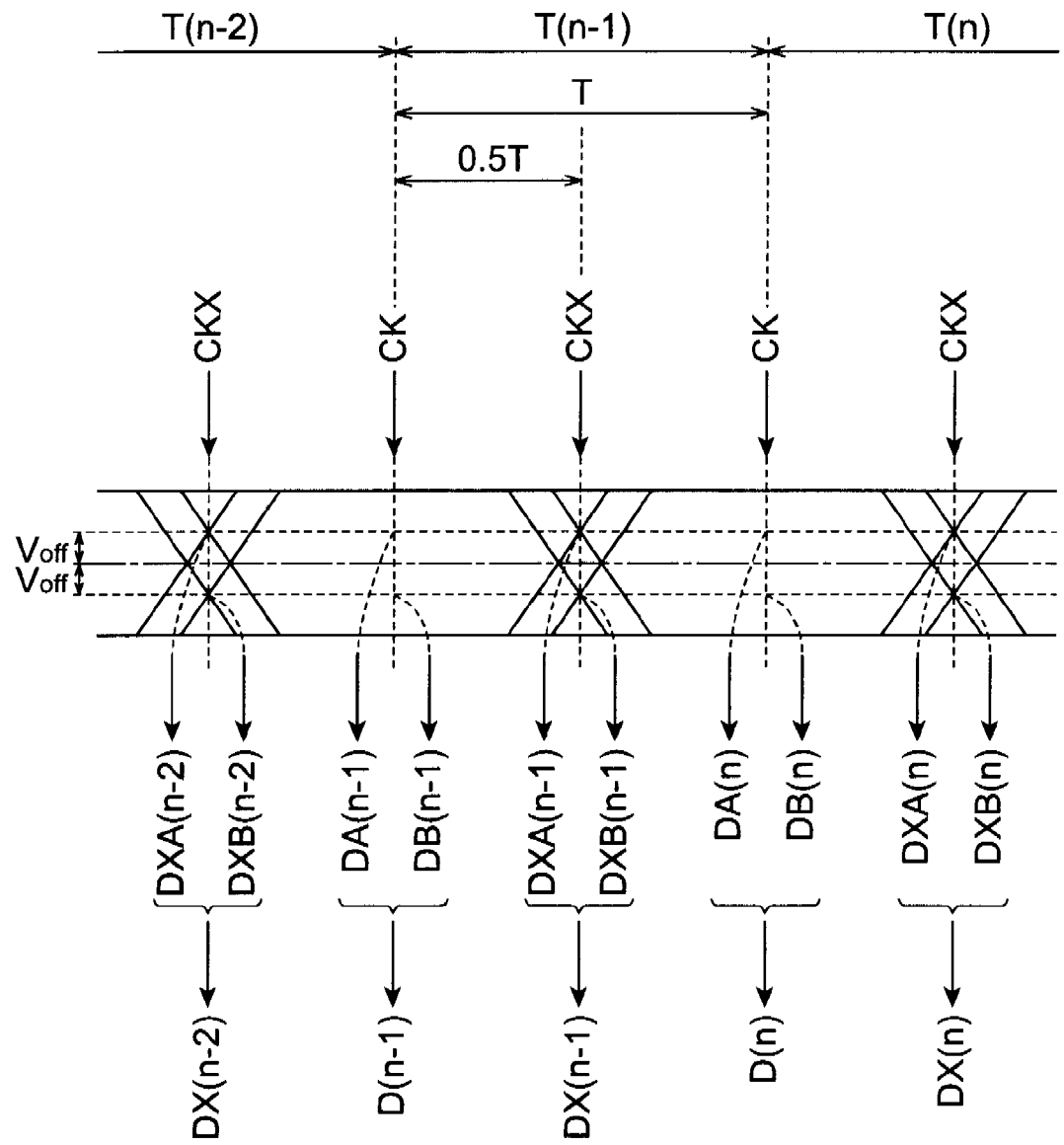
FIG. 4 shows the timing for sampling digital signal data of a clock data restoration device 1A according to the first embodiment.

FIG. 4 shows the timing for sampling digital signal data of the clock data restoration device 1A according to the first embodiment. FIG. 4 schematically shows an eye pattern of an input digital signal, shows the respective timings of clock signal CK and clock signal CKX which are output by the clock generation section 30 and input to sampler section 20A, and also shows the timing for digital value D(n) and the value DX(n) which are output by the sampler section 20A.

The equalizer section 10A adjusts the levels of the input digital signal and outputs the adjusted digital signals (the first and second signals) to the sampler section 20A, and comprises four addition circuits 111 to 114 and a DA conversion circuit 115. The DA conversion circuit 115 receives value DAVAL which is output by the equalizer control section 40A and generates and outputs an offset voltage value (±Voff). The addition circuits 111 and 113 add an offset voltage value (−Voff) from DA conversion circuit 115 and the input digital signal and output the first signal (=input digital signal −Voff) which is the addition result. In addition, the addition circuits 112 and 114 add the offset voltage value (+Voff) from the DA conversion circuit 115 and the input digital signal and output the second signal (=input digital signal +Voff) which is the addition result.

The sampler section 20A comprises four latch circuits 121 to 124, two selection circuits 125 and 126, and a latch circuit 127. The latch circuit 121 receives an input of the first signal which is output by addition circuit 111 and also receives an input of clock signal CK which is output by clock generation section 30, and samples and holds the value DA(n) of the first signal at the time indicated by the clock signal CK in each period T(n), and outputs value DA(n) to selection circuit 125. The latch circuit 122 receives an input of the second signal which is output by addition circuit 112 and receives an input of clock signal CK which is output by the clock generation section 30, and samples and holds a value DB(n) of the second signal at the time indicated by the clock signal CK in each period T(n) before outputting value DB(n) to the selection circuit 125.

The latch circuit 123 receives an input of the first signal which is output by addition circuit 113 and also receives an input of clock signal CKX which is output by the clock generation section 30, and samples and holds a value DAX(n) of the first signal at the time indicated by the clock signal CKX in each period T(n) before outputting value DAX(n) to the selection circuit 126. The latch circuit 124 receives an input of the second signal which is output by the addition circuit 114 and also receives an input of clock signal CKX which is output by the clock generation section 30, and samples and holds a value DBX(n) of the second signal at the time indicated by the clock signal CKX in each period T(n) before outputting value DBX(n) to the selection circuit 126.

The selection circuit 125 receives an input of value DA(n) which is output by the latch circuit 121, value DB(n) which is output by latch circuit 122 and value D(n−1) which is output by latch circuit 127, selects value DA(n) when value D(n−1) is a high level and outputs same as value D(n), and selects value DB(n) when value D(n−1) is a low level and outputs same as value D(n).

The selection circuit 126 receives an input of value DAX(n) which is output by the latch circuit 123, a value DBX(n) which is output by latch circuit 124, and a value D(n−1) which is output by latch circuit 127, and selects value DAX(n) when value D(n−1) is a high level and outputs same as value DX(n), and selects value DBX(n) when value D(n−1) is a low level and outputs same as value DX(n).

The latch circuit 127 receives and holds an input of a value D(n−1) which is output by the selection circuit 125 in each period T(n−1) and outputs value D(n−1) to each of the selection circuits 125 and 126 in the next period T(n).

Thus, in each period T(n), the sampler section 20A lets 'D(n)=DA(n)' and 'DX(n−11)=DXA(n−1) when value D(n−1) is a high level and lets 'D(n)=DB(n)' and 'DX(n−1)=DXB(n−1) when value D(n−1) is a low level and outputs the digital signal value D(n) at the time indicated by the clock signal CK and outputs the digital signal value DX(n) at the time indicated by the clock signal CKX.

The clock generation section 30 generates clock signal CK and clock signal CKX on the basis of the value D(n) and value DX(n) which are output by the sampler section 20A and comprises a phase relation detection circuit (BBPHD) 31, a charge pump circuit (CP) 32, a lowpass filter circuit (LPF) 33, and a voltage control oscillation circuit (VCO) 34.

The phase relation detection circuit 31 performs logic processing in accordance with the truth table in FIG. 5 on the basis of the value D(n) and value DX(n) which are output by the sampler section 20A and outputs the UP signal and DN signal. In other words, the phase relation detection circuit 31 outputs the UP signal which is a significant value when 'D(n−1)≠DX(n−1)=D(n)' and outputs the DN signal which is a significant value when 'D(n−1)=DX(n−1)≠D(n)' as signals representing the phase relation.

Figure 6:
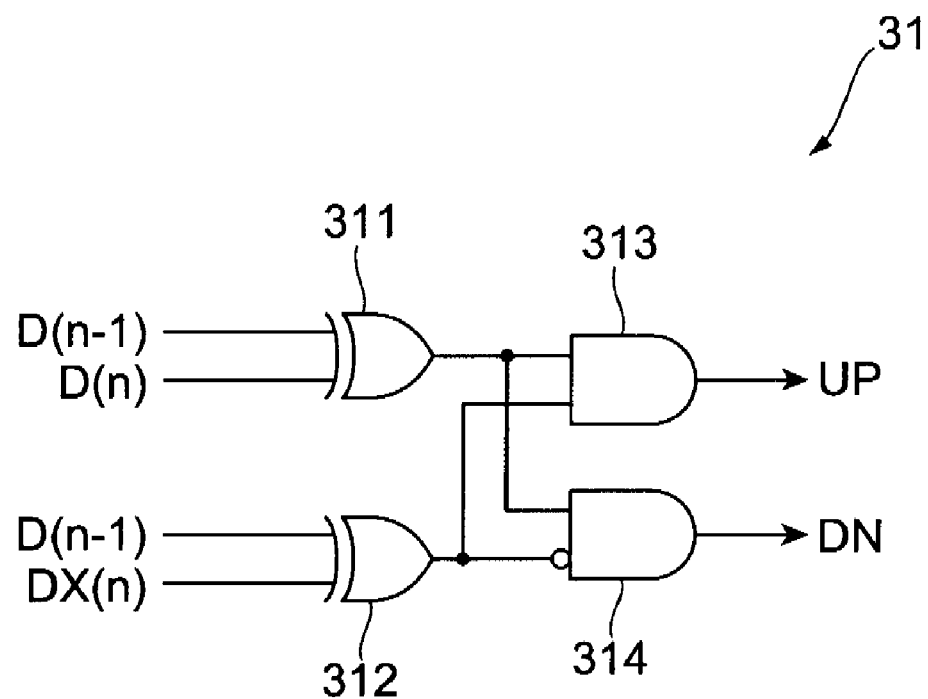
FIG. 6 is a circuit diagram of the phase relation detection circuit 31.

As shown by the circuit diagram in FIG. 6, the phase relation detection circuit 31 can comprise an exclusive-OR circuit 311 to which the value D(n−1) and the value D(n) are input, an exclusive-OR circuit 312 to which the value D(n−1) and the value DX(n) are input, a logical-AND circuit 313 to which the respective output values of the exclusive-OR circuit 311 and exclusive-OR circuit 312 are input and which outputs a UP signal, and a logical-AND circuit 314 to which the logical inversion values of the output value of the exclusive-OR circuit 311 and the output value of the exclusive-OR circuit 312 are input and which outputs the DN signal.

When the UP signal is a significant value, the phases of the clock signal CK and the clock signal CKX are required to be made earlier, because the phase of the clock signal CK lags the input digital signal. However, when the DN signal is a significant value, the phases of the clock signal CK and the clock signal CKX are required to be delayed, because the phase of clock signal CK is ahead of the input digital signal.

Therefore, the charge pump circuit 32 outputs either the charging current pulse or discharging current pulse depending on which of the UP signal and the DN signal output by the phase relation detection circuit 31 is a significant value to the lowpass filter circuit 33. The lowpass filter circuit 33 receives an input of a current pulse which is output by the charge pump circuit 32 and increases or reduces the output voltage value depending on whether the input current pulse is a charging current pulse or a discharging current pulse. The voltage control oscillation circuit 34 then generates a clock signal CK and clock signal CKX of a cycle which corresponds with the output voltage value from the lowpass filter circuit 33. Thus, the cycles of the clock signal CK and clock signal CKX which are generated by the clock generation section 30 are adjusted on the basis of the UP signal and DN signal.

Figure 7:
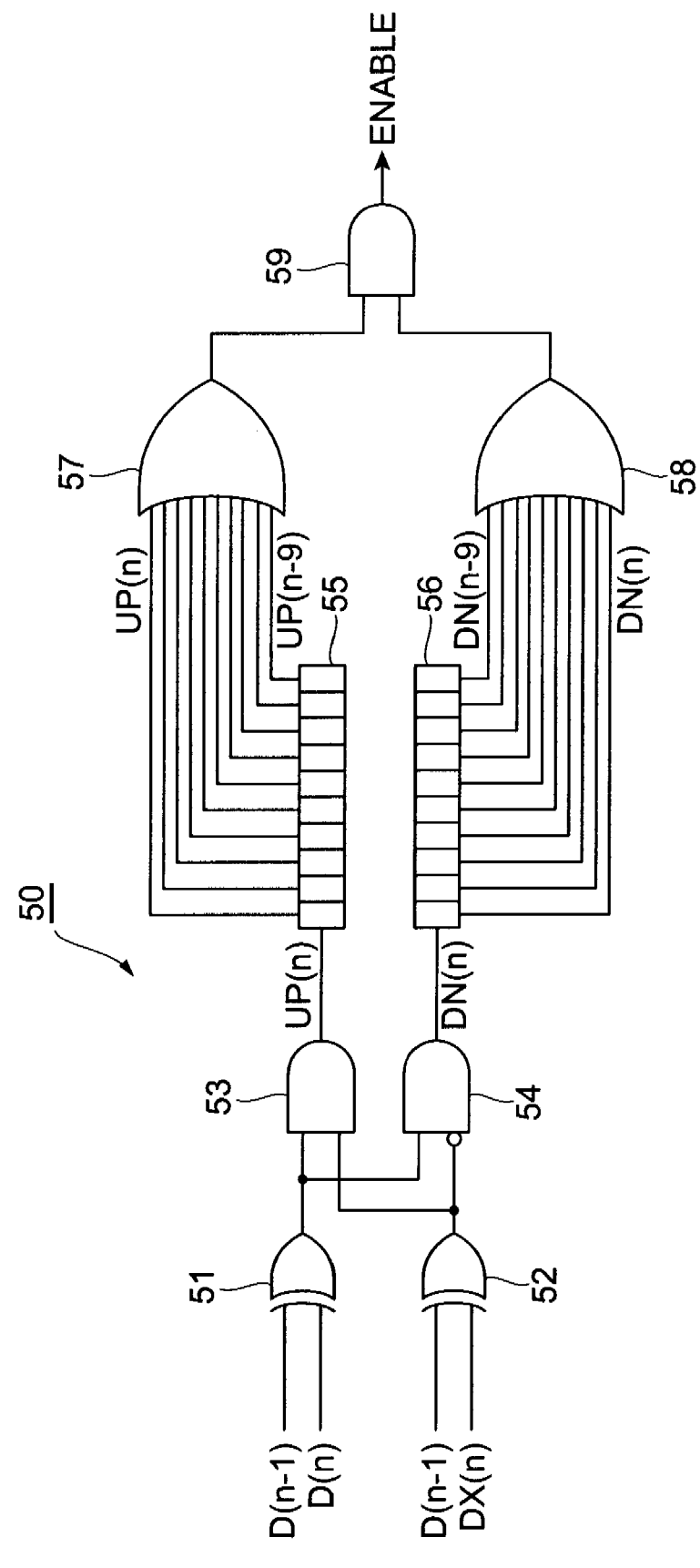
FIG. 7 is a circuit diagram of a phase monitor section 50.

FIG. 7 is a circuit diagram of the phase monitor section 50. The phase monitor section 50 is constituted by exclusive-OR circuits 51 and 52, logical-AND circuits 53 and 54, shift register circuits 55 and 56, logical-OR circuits 57 and 58, and a logical-AND circuit 59.

The exclusive-OR circuit 51 receives an input of value D(n−1) and value D(n) and outputs the exclusive-OR value of these two values. The exclusive-OR circuit 52 receives an input of value D(n−1) and value DX(n) and outputs the value of the exclusive-OR value of these two values. The logical-AND circuit 53 receives an input of the respective output values of the exclusive-OR circuit 51 and exclusive-OR circuit 52 and outputs value UP(n) which is the logical-AND value of the two values. The logical-AND circuit 54 receives an input of the logical inversion value of the output value of the exclusive-OR circuit 51 and the output value of the exclusive-OR circuit 52 and outputs value DN(n) which is the logical-AND value of the these two values. In other words, the value UP(n) is a significant value when 'D(n−1)≠DX(n−1)=D(n)' and value DN(n) is a significant value when 'D(n−1)=DX(n−1)≠D(n)'. The shift register circuit 55 receives an input of value UP(n) which is output by the logical-AND circuit 53 in each period T(n) and stores and outputs values UP(n−9) to UP(n) of ten previous consecutive periods (T(n−9) to T(n)) which include the period. Furthermore, the shift register circuit 56 receives an input of value DN(n) which is output by logical-AND circuit 54 in each period T(n) and stores and outputs the value DN(n−9) to DN(n) of ten previous consecutive periods (T(n−9) to T(n)) which include the period.

The logical-OR circuit 57 receives an input of values UP(n−9) to UP(n) which are output by the shift register circuit 55 and outputs the logical-OR value of these ten values. The logical-OR circuit 58 receives an input of values DN(n−9) to DN(n) which are output by the shift register circuit 56 and outputs the logical-OR value of these ten values. The logical-AND circuit 59 receives an input of the values which are output by the logical-OR circuit 57 and logical-OR circuit 58 and outputs a value ENABLE which is the logical-AND value of these two values.

In other words, when at least one of the values UP(n−9) to UP(n) is a significant value and at least one of the values DN(n−9) to DN(n) is a significant value, the value ENABLE which is output by the logical-AND circuit 59 is a significant value. However, when all of the values UP(n−9) to UP(n) are insignificant values or when all of the values DN(n−9) to DN(n) are insignificant values, the value ENABLE which is output by the logical-AND circuit 59 is an insignificant value. The fact that the value ENABLE is an insignificant value represents the fact that the phase difference between the clock signal CK and digital signal is greater than a predetermined value.

The output of the value ENABLE of the phase monitor section 50 may be carried out once in each period T(n) or may be carried out once every M periods (10 periods, for example). In the former case, the value ENABLE is determined for ten previous consecutive periods (T(n−9) to T(n)) which include a certain period T(n) and the subsequent value ENABLE is determined for the ten periods (T(n−8) to T(n+1)) in the next period T(n−1). In the latter case, the value ENABLE is determined for ten previous consecutive periods (T(n−9) to T(n)) which include a certain period T(n) and the next value ENABLE is determined for the ten periods (T(n+M−9) to T(n+M)) after M periods from these periods.

The reasons why it is judged over ten periods whether a period in which the UP signal and DN signal respectively are significant values exists are as follows. In other words, in cases where there is a data transition between a certain bit of the input digital signal and the next bit, one of the UP signal and the DN signal is a significant value while the other is an insignificant value. In cases where there is no data transition between a certain bit and the next bit of the input digital signal, both the UP signal and the DN signal are insignificant values.

If the respective phases of the clock signal CK and clock signal CKX are suitable, a period in which the UP signal is a significant value exists and a period in which the DN signal is a significant value also exists during a certain plurality of consecutive periods. However, if the respective phases of the clock signal CK and clock signal CKX are displaced, the UP signal is always an insignificant value or the DN signal is always an insignificant value during a certain plurality of consecutive periods.

In the case of 8B10B code, which is employed in serial data communications, a data transition is guaranteed two or more times in 10 bits. Therefore, if it is judged whether a period in which the UP signal and DN signal are each significant values exists over ten periods, if the respective phases of the clock signal CK and clock signal CKX are suitable, a period in which the UP signal is a significant value is exist inevitably among the ten periods and a period in which the DN signal is a significant value also exist inevitably among the ten periods.

Conversely, in cases where the DN signal is always an insignificant value over ten periods or in cases where the UP signal is always an insignificant value over ten periods, it is judged that the respective phases of the clock signal CK and the clock signal CKX have been displaced and, consequently, the shift from a reasonable value for the offset amount Voff cannot be accurately detected. For the reasons discussed earlier, it is preferable to judge the existence of a period in which the UP signal and DN signal are significant values respectively over ten periods.

The value ENABLE which is output by phase monitor section 50 is input to the equalizer control section 40A. When the value ENABLE is a significant value, the equalizer control section 40A performs control of the level adjustment amount (that is, the offset voltage value which is applied to the input digital signal) of the digital signal by the equalizer section 10. However, when the value ENABLE is an insignificant value, the equalizer control section 40A stops the control of the level adjustment amount of the digital signal by the equalizer section 10.

Figure 8:
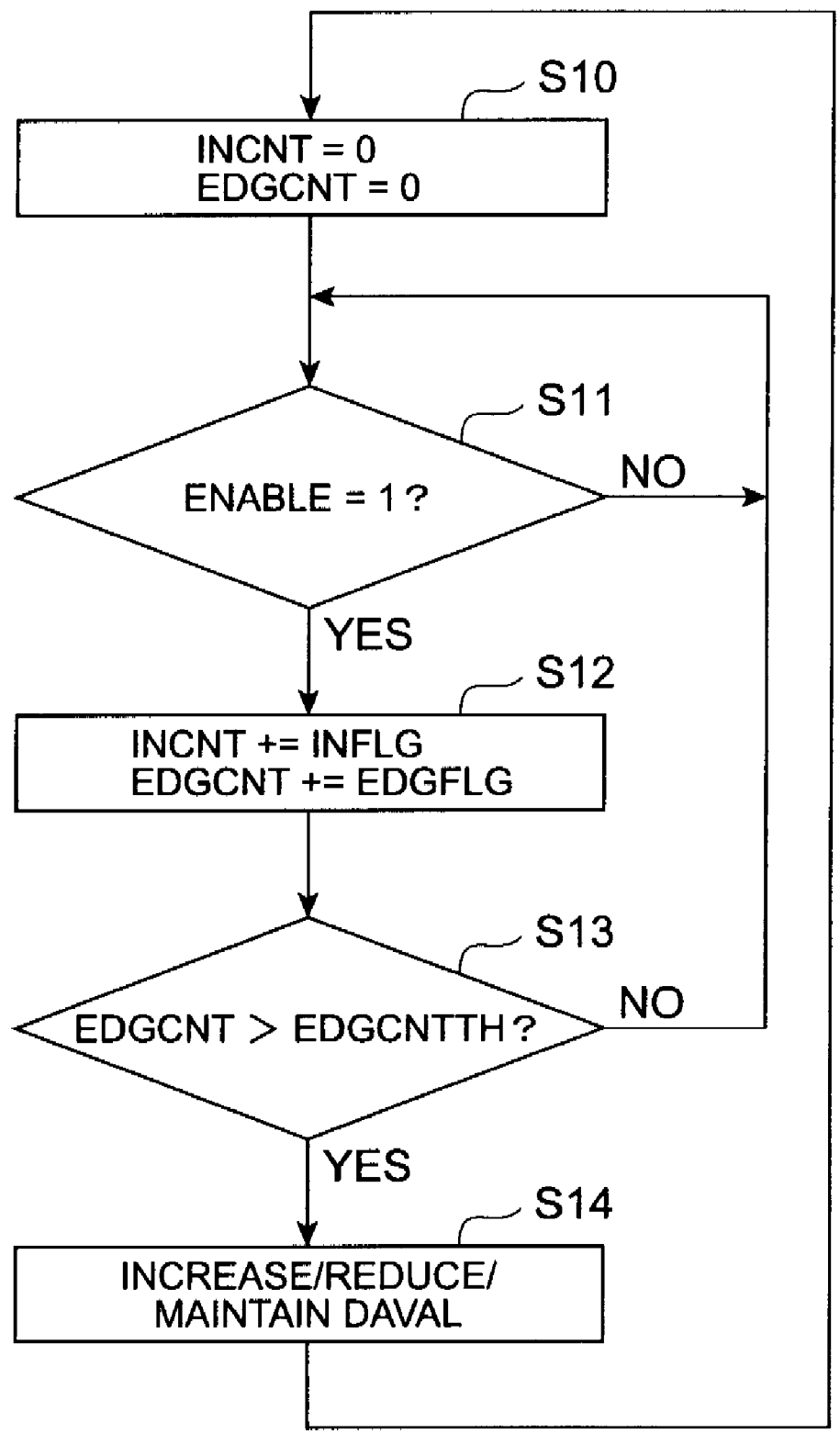
FIG. 8 is a flowchart which illustrates processing by an equalizer control section 40A which is contained in a clock data restoration device 1A according to the first embodiment.
Figure 9:
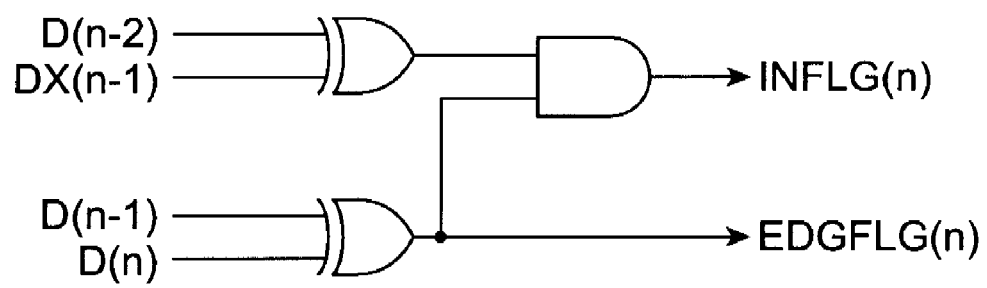
FIG. 9 is a circuit diagram to determine the respective values of variable INFLG and variable EDGFLG which are used in the processing of the equalizer control section 40A which is contained in the clock data restoration device 1A according to the first embodiment.

FIG. 8 is a flowchart to illustrate the processing of the equalizer control section 40A. The equalizer control section 40A uses the value ENABLE which is output by the phase monitor section 50 and uses a variable INCNT, a variable EDGCNT, a variable INFLG, a variable EDGFLG, a constant INCCNTTH, and a constant EDGCNTTH to determine a value DAVAL which is to be output to the DA conversion circuit 115 which is contained in the equalizer section 10A. The respective values of the variable INFLG and variable EDGFLG are determined from value D(n) and value DX(n) by means of the logic circuit shown in FIG. 9 and are represented as 'EDGFLG(n)=D(n−1) to D(n)' and 'INFLG(n)= EDGFLG(n)*{D(n−2) to DX(n−1)}'. Here, the processing code '^' represents the exclusive-OR.

In step S10, the respective values of variable INCNT and variable EDGCNT are set to the initial value 0. In the step S11 which follows, it is judged whether the value ENABLE which is output by the phase monitor section 50 is a significant value and, if the value ENABLE is a significant value, the processing advances to step S12 and, if not, the processing stops at step S11. In step S12, the value of the variable INFLG is added to the value of variable INCNT and renders the addition value a new value for variable INCNT. Further, in step S12, the value of the variable EDGFLG is added to the value of the variable EDGCNT and the addition value becomes a new value for variable EDGCNT.

In step S13 which follows, it is judged whether the value of the variable EDGCNT is greater than a constant EDGCNTTH and, if the value of variable EDGCNT is greater than the constant EDGCNTTH, the processing advances to step S14 and, if the value of variable EDGCNT is equal to or less than constant EDGCNTTH, the processing returns to step S11. That is, until it is judged in step S13 that the value of variable EDGCNT is greater than the constant EDGCNTTH, the respective processing of steps S11 to S13 will be carried out.

The respective processing of steps S11 to S13 of the equalizer control section 40A may be performed once in each period T(n) as in the case of the output of value ENABLE of the phase monitor section 50 or may be performed once every M periods (10 periods, for example). In the latter case, in step S12, the total value of variable INFLG which is obtained for every M periods is added to the value of variable INCNT and the total value of variable EDGFLG which is obtained for each of the M periods is added to the value of variable EDGCNT.

In step S14, different processing is performed divided into three cases (a) to (c) shown hereinbelow. In other words, in cases where the value of variable INCNT is smaller than constant INCNTTH, the value DAVAL is increased and the new value DAVAL is reported to DA conversion circuit 115. In cases where the value of variable INCNT is greater than a value obtained by subtracting constant INCNTTH from the value of variable EDGCNT, the value DAVAL is reduced and the new value DAVAL is reported to the DA conversion circuit 115. Furthermore, in neither of the two cases is the value DAVAL maintained. Further, when the processing of step S14 ends, the processing returns to step S10 and the processing illustrated thus far is repeated.

(a) In case of [INCNT<INCNTTH]⇒Increase DEVAL (b) In case of [FNCNT>EDGCNT-INCNTTH]⇒Decrease DEVAL (c) In other cases⇒Maintain DEVAL [Equation 1]

As a result of the processing of equalizer control section 40A above, value DAVAL is adjusted so that the value of variable INCNT exists in a fixed range (INCNTTH to EDGCNT-INCNTTH) and the offset amount (±Voff) of the equalizer section 10A is adjusted. Thus, the offset amount of the equalizer section 10A is set to a suitable value.

Furthermore, in the equalizer control section 40A, in cases where value ENABLE which is output by the phase monitor section 50 is a significant value (that is, in cases where at least one of values UP(n−9) to UP(n) is a significant value and where at least one of values DN(n−9) to DN(n) is a significant value), value D and value DN during this time are referenced when updating value DAVAL, and control of the level adjustment amount of the digital signal by the equalizer section 10A is carried out.

However, in the equalizer control section 40A, in cases where the value ENABLE which is output by the phase monitor section 50 is an insignificant value (that is, in cases where all of the values UP(n−9) to UP(n) are insignificant values or in cases where all of the values DN(n−9) to DN(n) are insignificant values), the phase difference between clock signal CK and the digital signal is greater than a predetermined value, value D and value DN are not referenced when updating value DAVAL, and control of the level adjustment amount of the digital signal by the equalizer section 10A is stopped.

Thus, in the case of clock data restoration device 1A according to the first embodiment, when the loss which the digital signal undergoes during transmission changes, the level adjustment amount (offset amount) of the digital signal of the equalizer section 10A is set to a suitable value and the clock signal and data can be more accurately restored.

Second Embodiment

Figure 10:
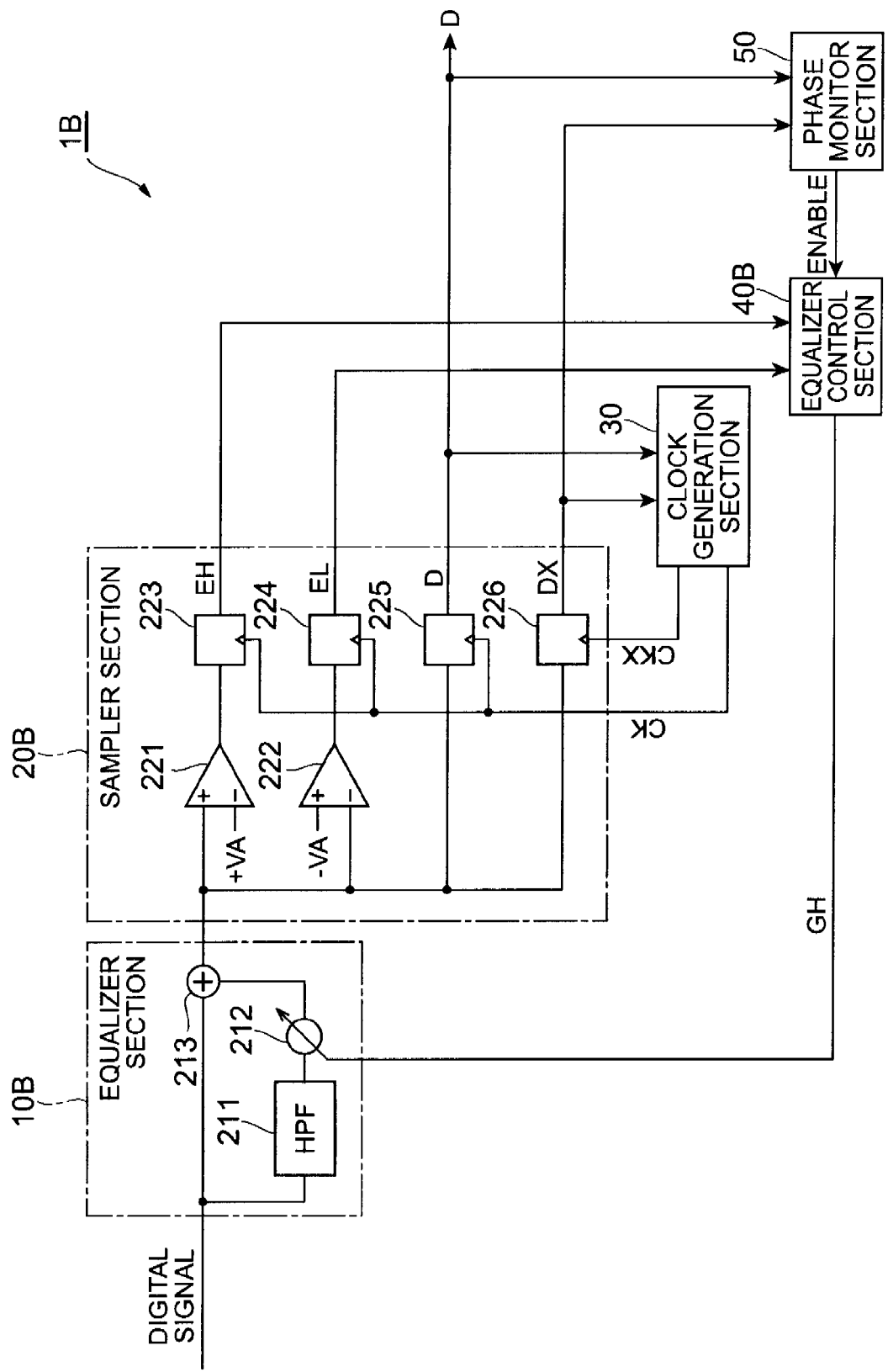
FIG. 10 is a constitutional view of a clock data restoration device 1B according to a second embodiment.

FIG. 10 is a constitutional view of the clock data restoration device 1B according to the second embodiment. The clock data restoration device 1B shown in FIG. 10 is a device which restores a clock signal and data on the basis of a digital signal that is input and comprises an equalizer section 10B, a sampler section 20B, a clock generation section 30, an equalizer control section 40B, and a phase monitor section 50. FIG. 10 schematically shows the respective circuit constitutions of the equalizer section 10B and sampler section 20B. The respective constitutions of the clock generation section 30 and phase monitor section 50 of the second embodiment are the same as the case of the first embodiment.

Figure 11:
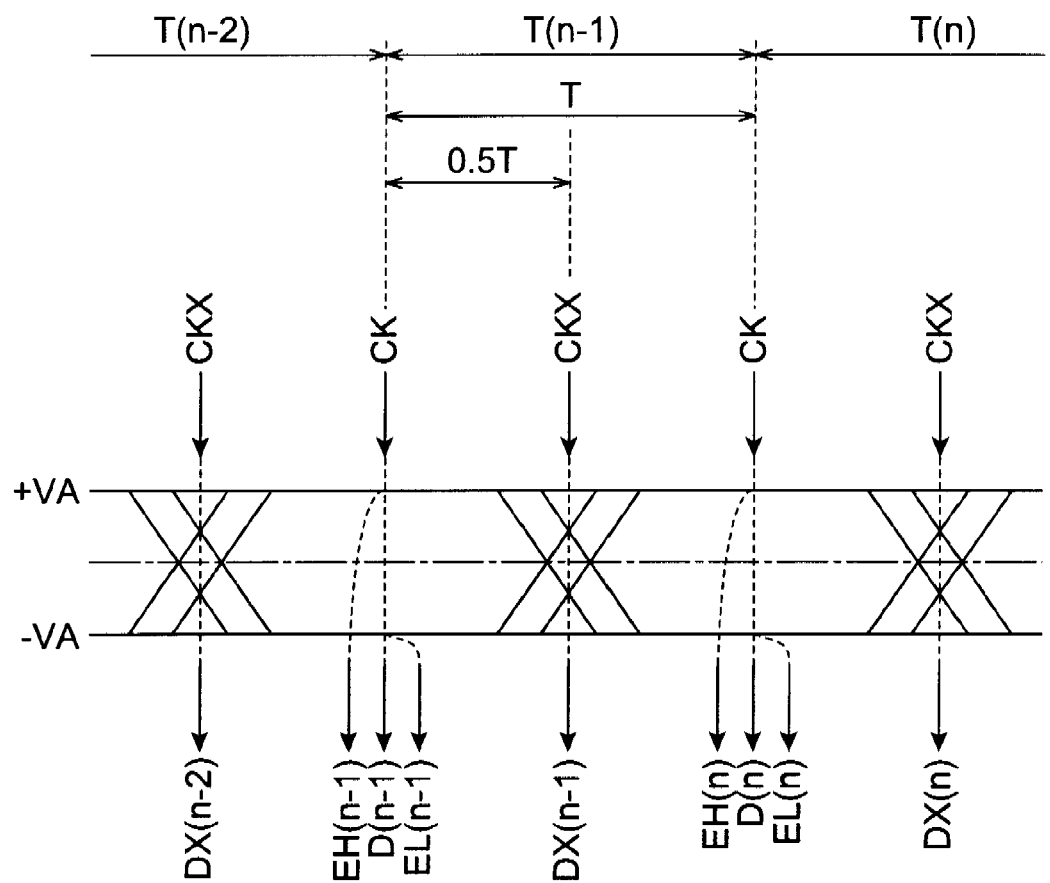
FIG. 11 shows the timing for sampling digital signal data of the clock data restoration device 1B according to the second embodiment.

FIG. 11 shows the timing for sampling digital signal data of the clock data restoration device 1B according to the second embodiment. FIG. 11 shows the eye pattern of the input digital signal is schematically as well as the respective timings of the clock signal CK and clock signal CKX which are output by the clock generation section 30 and input to the sampler section 20B and also shows the timing of the digital value D(n), value DX(n), and value EH(n), and value EL(n) which are output by the sampler section 20B.

The equalizer section 10B adjusts the levels of the input digital signals and outputs the adjusted digital signal (a signal obtained by amplifying the high frequency component) to the sampler section 20B and comprises a highpass filter circuit (HPF) 211, an amplifier circuit 212 and addition circuit 213. The highpass filter circuit 211 selectively allows the high frequency component in the input digital signal to pass and outputs same to the amplifier circuit 212. The amplifier circuit 212 amplifies the signal which is output by the highpass filter circuit 211 and outputs same to the addition circuit 213. The gain of the amplifier circuit 212 is set upon receipt of a value GH which is output by the equalizer section 10B. Further, the addition circuit 213 receives an input of the input digital signal and receives an input of the signal output by the amplifier circuit 212 and outputs the result of adding these inputs to the sampler section 20B. With regard to the digital signal which is output by the equalizer section 10B and input to the sampler section 20B, the high frequency component of the input digital signal is amplified, whereby the loss which the high frequency component of the digital signal undergoes during transmission is compensated for.

The sampler section 20B comprises two comparison circuits 221 and 222 and four latch circuits 223 to 226. The comparison circuit 221 receives an input of a digital signal which is output by the equalizer section 10B, receives an input of a reference voltage value (+VA) and outputs a significant value when the digital signal value is greater than the reference voltage value (+VA) and outputs a insignificant value when the digital signal value is not greater than the reference voltage value (+VA). The comparison circuit 222 receives an input of a digital signal which is output by the equalizer section 10B and also receives an input of a reference voltage value (−VA), and outputs a significant value when the digital signal value is smaller than the reference voltage value (−VA) and outputs an insignificant value when the digital signal value is not smaller than the reference voltage value (−VA).

The latch circuit 223 receives an input of a comparison signal which is output by the comparison circuit 221, receives an input of clock signal CK which is output by the clock generation section 30, and samples, holds, and outputs the value EH(n) of the comparison signal at the time indicated by the clock signal CK in each period T(n). The latch circuit 224 receives an input of a comparison signal which is output by the comparison circuit 222, receives an input of clock signal CK which is output by the clock generation section 30 and samples, holds, and outputs value EL(n) of the comparison signal at the time indicated by the clock signal CK in each period T(n).

The latch circuit 225 receives an input of a digital signal which is output by the equalizer section 10B and receives an input of clock signal CK which is output by the clock generation section 30, and samples, holds, and outputs the digital signal value D(n) at the time indicated by the clock signal CK in each period T(n). The latch circuit 226 receives an input of a digital signal which is output by the equalizer section 10B and receives an input of clock signal CKX which is output by the clock generation section 30, and samples, holds, and outputs the digital signal value DX(n) at the time indicated by the clock signal CKX in each period T(n).

Thus, the sampler section 20B outputs value D(n) of the digital signal at the time indicated by clock signal CK and outputs value DX(n) of the digital signal at the time indicated by the clock signal CKX. In addition, the sampler section 20B outputs a value EH(n) which is a significant value when the digital signal value at the time indicated by clock signal CK is greater than the reference voltage value (+VA) and outputs value EL(n) which is a significant value when the digital signal value at the time indicated by the clock signal CK is smaller than the reference voltage value (−VA).

Figure 12:
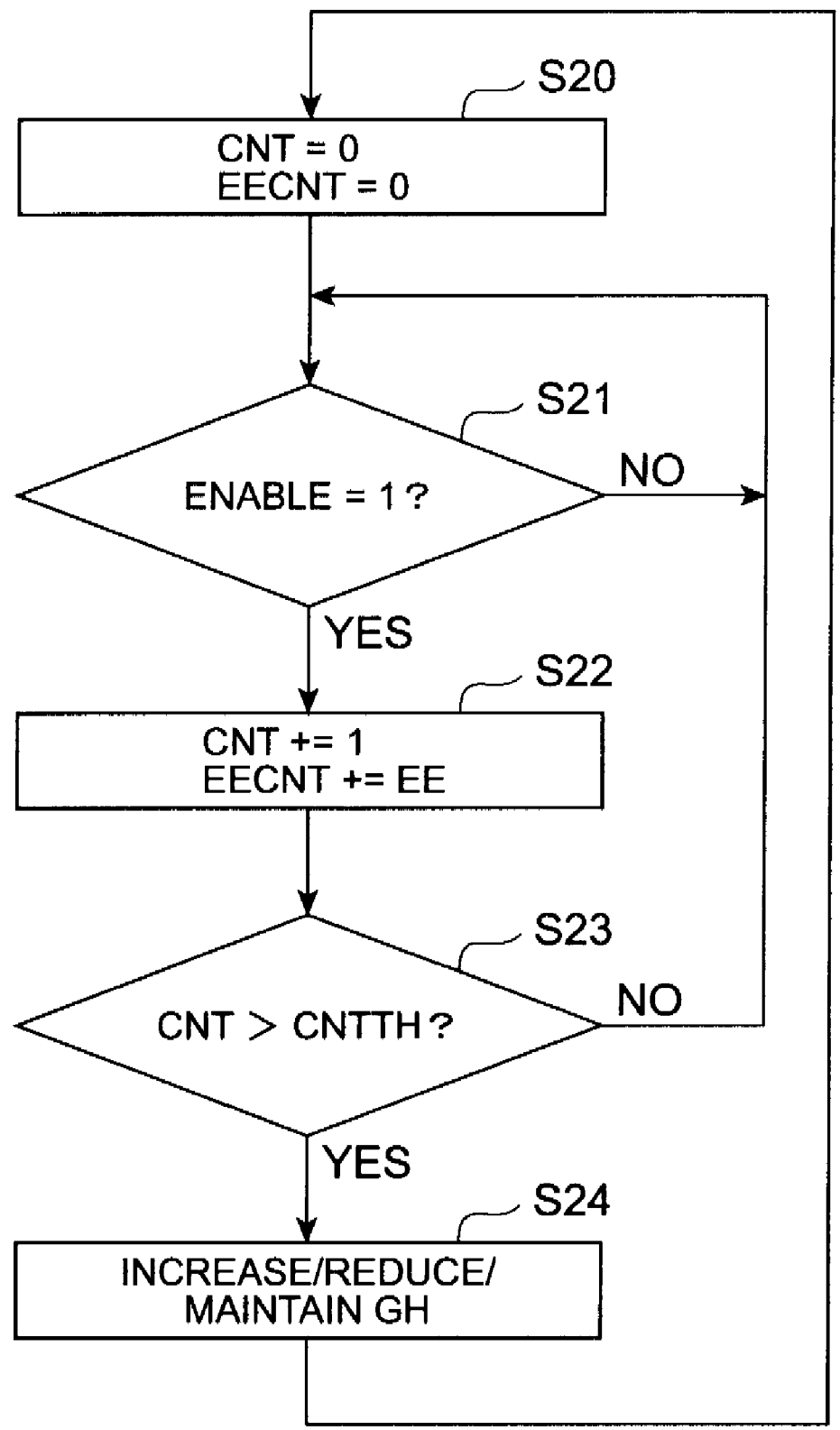
FIG. 12 is a flowchart which illustrates processing by the equalizer control section 40B which is contained in the clock data restoration device 1B according to the first embodiment.
Figure 13:
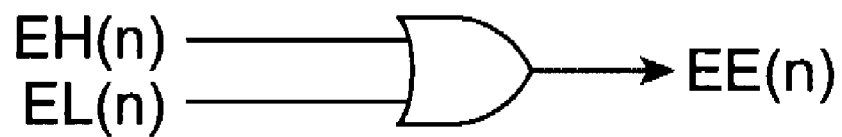
FIG. 13 is a circuit diagram to determine the value of a variable EE which is used in the processing of the equalizer control section 40B which is contained in the clock data restoration device 1B according to the first embodiment.

FIG. 12 is a flowchart which illustrates the processing of the equalizer control section 40B. The equalizer control section 40B uses value ENABLE which is output by the phase monitor section 50 and uses variable CNT, variable EECNT, variable EE, constant CNTTH, and constant EECNTTH to determine a value GH which is output to the amplifier circuit 212 which is contained in the equalizer section 10B. The value of variable EE is determined from value EH(n) and value EL(n) by means of the logic circuit shown in FIG. 13 and is denoted 'EE(n)=EH(n)+EL(n)'.

In step S20, the respective values of variable CNT and variable EECNT are set to the initial value 0. In step S21 which follows, it is judged whether the value ENABLE output by the phase monitor section 50 is a significant value and, if value ENABLE is a significant value, the processing advances to step S22. If value ENABLE is not a significant value, the processing stops at step S21. In step S22, value 1 is added to the value of variable CNT and the addition value becomes a new value for variable CNT. Furthermore, in step S22, the value of variable EE is added to the value of variable EECNT and the addition value becomes a new value for variable EECNT.

In step S23 which follows, it is judged whether the value of variable CNT is greater than constant CNTTH and, if the value of variable CNT is greater than constant CNTTH, the processing advances to step S24 and, if the value of variable CNT is equal to or less than constant CNTTH, the processing returns to step S21. In other words, until it is judged that the value of variable CNT is greater than constant CNTTH in step S23, the respective processing of steps S21 to S23 is carried out.

The respective processing of steps S21 to S23 of the equalizer control section 40B may be carried out once in each period T(n) as in the case of the output of value ENABLE of the phase monitor section 50 or may be performed once every M periods (10 periods, for example). In the latter case, in step S22, value M is added to the value of variable CNT and the total value of variable EE which is obtained for every M periods is added to the value of variable EECNT.

In step S24, different processing is performed divided into three cases (a) to (c) shown hereinbelow. In other words, in cases where the value of variable EECNT is smaller than constant EECNTTH, the value GH is increased and the new value GH is reported to the amplification circuit 212. In cases where the value of variable EECNT is greater than a value obtained by subtracting constant EECNTTH from the value of variable CNT, the value GH is reduced and the new value GH is reported to the amplification circuit 212. Furthermore, in neither of the two cases is the value GH maintained. Further, when the processing of step S24 ends, the processing returns to step S20 and the processing illustrated thus far is repeated.

(a) In case of [EECNT<EECNTTH]⇒Increase GH (b) In case of [EECNT>CNT−EECNTTH]⇒Decrease GH (c) In other cases⇒Maintain GH  [Equation 2]

As a result of the processing of equalizer control section 40B above, value GH is adjusted so that the value of variable EECNT exists in a fixed range (EECNTTH to CNT−EECNTTH) and the amplification factor of the amplification circuit 212 which is contained in the equalizer section 10B is adjusted. Thus, the amplification factor of the high frequency component of the equalizer section 10B is set to the suitable value.

In addition, in the equalizer control section 40B, in cases where value ENABLE which is output by the phase monitor section 50 is a significant value (that is, in cases where at least one of values UP(n−9) to UP(n) is a significant value and where at least one of values DN(n−9) to DN(n) is a significant value), value D and value DN during this time are referenced when updating value GH, and control of the level adjustment amount of the digital signal by the equalizer section 10B is carried out.

However, in the equalizer control section 40B, in cases where the value ENABLE which is output by the phase monitor section 50 is an insignificant value (that is, in cases where all of the values UP(n−9) to UP(n) are insignificant values or in cases where all of the values DN(n−9) to DN(n) are insignificant values), the phase difference between clock signal CK and the digital signal is greater than a predetermined value, value D and value DN are not referenced when updating value GH and control of the level adjustment amount of the digital signal by the equalizer section 10B is stopped.

Thus, in the case of clock data restoration device 1B according to the second embodiment, in cases where the loss which the digital signal undergoes during transmission changes and so forth, the level adjustment amount (the amplification factor of the high frequency component) of the digital signal of the equalizer section 10B is set to a suitable value and the clock signal and data can be more accurately restored.

INDUSTRIAL APPLICABILITY

The present invention provides a clock data restoration device which is capable of restoring a clock signal and data more accurately.

The invention claimed is:

1. A clock data restoration device which restores a clock signal and data on the basis of an input digital signal, comprising:
   an equalizer section which adjusts a level of the input digital signal and outputs the adjusted digital signal;
   a sampler section which receives an input of a clock signal CK and a clock signal CKX which have a same cycle T as well as an input of the digital signal output by the equalizer section, and which samples, holds, and outputs, in each nth period T(n) of the cycle, a value D(n) of the digital signal at a time $t_C$ indicated by the clock signal CK, and a value DX(n) of the digital signal at a time $t_X$ indicated by the clock signal CKX (where $t_C < t_X$ and n is an integer);
   a clock generation section which, in each period T(n), adjusts the cycle T or the phase so that a phase difference between the clock signal CK and the digital signal decreases on the basis of the value D(n) and the value DX(n) which are output by the sampler section, and outputs the clock signal CK and the clock signal CKX which satisfy the relation '$t_X - t_C = T/2$' to the sampler section;
   an equalizer control section which, in each period T(n), performs control of a level adjustment amount of the digital signal by the equalizer section on the basis of the level of the digital signal which is output by the equalizer section or the value D(n) and the value DX(n) which are output by the sampler section; and
   a phase monitor section which, in each period T(n), detects a phase relation between the clock signal CK and the digital signal on the basis of the value D(n) and the value DX(n) which are output by the sampler section, and, when the phase difference is greater than a predetermined value, stops control of the level adjustment amount of the digital signal by the equalizer control section.

2. The clock data restoration device according to claim 1, wherein the clock generation section adjusts the cycle T or the phase on the basis of a UP signal which is a significant value when 'D(n−1)≠DX(n−11)=D(n)' and a DN signal which is a significant value when 'D(n−1)=DX(n−1)≠D(n)', and outputs the clock signal CK and the clock signal CKX.

3. The clock data restoration device according to claim 1, wherein the phase monitor section detects the phase relation between the clock signal CK and the digital signal on the basis of a UP signal which is a significant value when 'D(n−1)≠DX(n−1)=D(n)' and a DN signal which is a significant value when 'D(n−1)=DX(n−1)≠D(n)'.

4. The clock data restoration device according to claim 3, wherein, in each period T(n), the phase monitor section judges that the phase difference is greater than a predetermined value when either the UP signal or the DN signal is not a significant value in ten previous consecutive periods (T(n−9) to T(n)) which include the period, and stops control of the level adjustment amount of the digital signal by the equalizer control section.

* * * * *